(12) United States Patent
Cai et al.

(10) Patent No.: US 8,978,244 B2
(45) Date of Patent: Mar. 17, 2015

(54) METHOD FOR MANUFACTURING PRINTED CIRCUIT BOARD

(75) Inventors: Xue-Jun Cai, Shenzhen (CN); Zhi-Yong Li, Shenzhen (CN); Chao Liu, Shenzhen (CN)

(73) Assignees: FuKui Precision Component (Shenzhen) Co., Ltd., Shenzhen (CN); FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 965 days.

(21) Appl. No.: 13/116,001

(22) Filed: May 26, 2011

(65) Prior Publication Data

US 2011/0302775 A1 Dec. 15, 2011

(30) Foreign Application Priority Data

Jun. 10, 2010 (CN) .......................... 2010 1 0195875

(51) Int. Cl.
*H05K 3/20* (2006.01)
*H05K 3/46* (2006.01)

(52) U.S. Cl.
CPC .............. *H05K 3/4697* (2013.01); *H05K 3/462* (2013.01); *H05K 3/4647* (2013.01); *H05K 2203/061* (2013.01); *H05K 2203/0733* (2013.01)
USPC ................................ 29/831; 29/846; 174/262

(58) Field of Classification Search
CPC ... H05K 3/4697; H05K 3/462; H05K 3/4647; H05K 2203/0733; H05K 2203/061
USPC ............ 29/831, 832, 842, 846, 851; 156/263; 174/260–262; 361/767, 770
See application file for complete search history.

(56) References Cited

U.S. PATENT DOCUMENTS

| 5,622,588 A * | 4/1997 | Weber ............................. 29/830 |
| 6,329,609 B1 * | 12/2001 | Kaja et al. ..................... 174/262 |
| 7,562,446 B2 * | 7/2009 | Jung et al. ....................... 29/846 |

FOREIGN PATENT DOCUMENTS

| CN | 201369335 Y | 12/2009 |
| JP | 9-148749 A | 6/1997 |
| JP | 2005-268416 A | 9/2005 |

* cited by examiner

*Primary Examiner* — Donghai D Nguyen
(74) *Attorney, Agent, or Firm* — Novak Druce Connolly Bove + Quigg LLP (57) ABSTRACT

A method for manufacturing a printed circuit board with cavity includes following steps. First, a first substrate is provided. The first substrate includes a first electrically conductive layer defining an exposed portion and a laminating portion. Second, a second substrate is provided. The second substrate includes an unwanted portion corresponding to the exposed portion and a preserving portion. Third, a first annular bump surrounding the exposed portion is formed. Fourth, a second annular bump surrounding the unwanted portion is formed. Fifth, a first adhesive layer defining an opening is provided. Sixth, the first and second substrates are laminated to the first adhesive layer, the exposed portion and the unwanted portion are exposed in the opening, and the second annular bump is in contact with the first annular bump. Seventh, the unwanted portion is removed and a cavity is defined, the exposed portion is exposed in the cavity.

8 Claims, 12 Drawing Sheets

METHOD FOR MANUFACTURING PRINTED CIRCUIT BOARD

BACKGROUND

1. Technical Field

The present disclosure relates to the manufacturing of printed circuit boards, particularly to a method for manufacturing a printed circuit board with a cavity.

2. Description of Related Art

Printed circuit boards (PCBs) are widely used in electronic devices. Some PCBs require a cavity. The cavity may be configured to accommodate an electronic component, which is in electrical communication with the PCB.

A typical method for manufacturing a printed circuit board with a cavity includes following steps. First, a first substrate is provided. The first substrate includes a circuit layer, which has an electrically conductive wiring and a pad. Second, the circuit layer of the first substrate is covered with a protective layer. Third, a second substrate is laminated to the circuit layer via an adhesive layer to obtain a PCB substrate. Fourth, a portion of the second substrate which is overlaid on the pad is removed, thus a cavity is defined in the PCB substrate. Finally, the protective layer in the cavity is removed, and thus the pad is exposed. As such, an electronic component can be mounted in the cavity and be in electrical communication with the pad.

However, the protective layer covering the pad is not easy to remove. If there is any protective layer remaining in the cavity, reliability of the connection between the pad and the electronic component will be affected.

What is needed, therefore, is a method for manufacturing the printed circuit board with cavity which can overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

A method for manufacturing a printed circuit board according to an embodiment will now be described in detail below with reference to the drawings.

The method includes the steps in no particular order of:

(1) providing a first substrate, the first substrate comprising a first electrically conductive layer, the first electrically conductive layer comprising an exposed portion and a laminating portion surrounding the exposed portion;

(2) providing a second substrate, the second substrate comprising an unwanted portion corresponding to the exposed portion and a preserving portion corresponding to the laminating portion;

(3) forming a first annular bump on the first substrate, the first annular bump extending along an imaginary boundary line of the exposed portion of the first substrate portion;

(4) forming a second annular bump on the second substrate, the second annular bump extending along an imaginary boundary line of the unwanted portion of the second substrate, the second annular bump corresponds to the first annular bump;

(5) providing a first adhesive layer which defines an opening therein;

(6) laminating the first substrate, the second substrate, and the first adhesive layer together to form a laminated structure in such a manner that the first adhesive layer is sandwiched between the first and second substrates, the exposed portion and the unwanted portion are exposed in the opening, and the second annular bump is in contact with the first annular bump; and (7) removing the unwanted portion of the second substrate and defining a cavity in the laminated structure, the exposed portion being exposed in the cavity.

Figure 1:
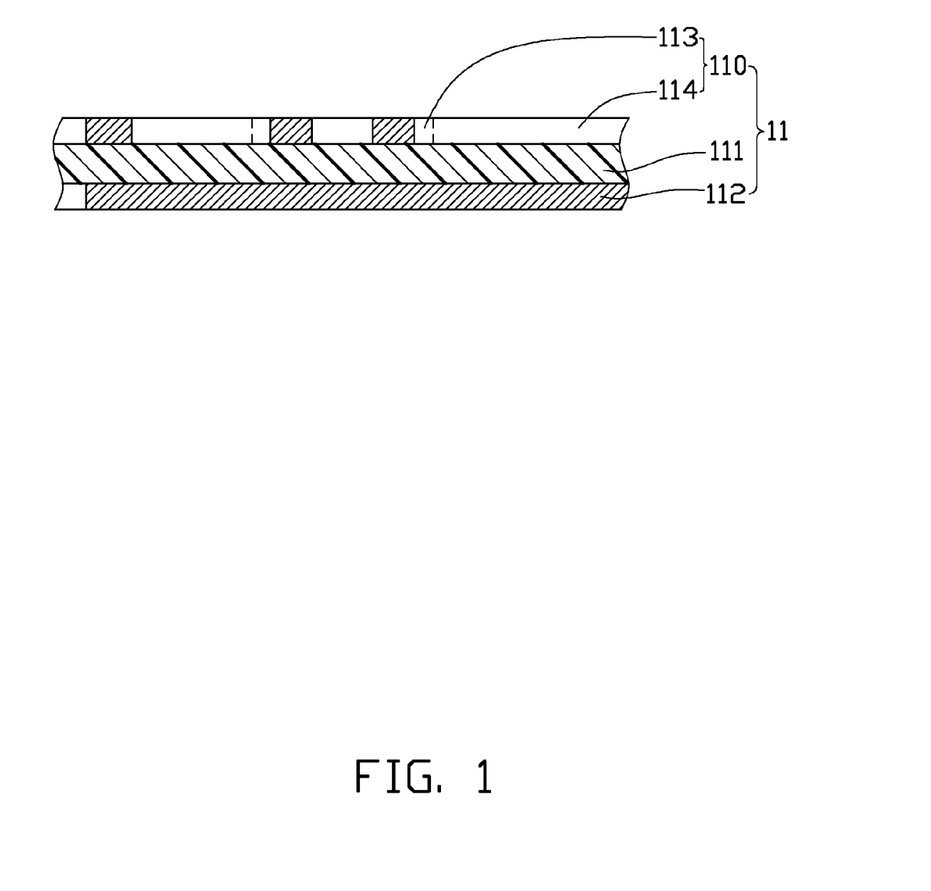
FIG. 1 is a cross-sectional view of a first substrate, the first substrate including a first electrically conductive layer, the first electrically conductive layer including an exposed portion and a laminating portion surrounding the exposed portion.
Figure 2:
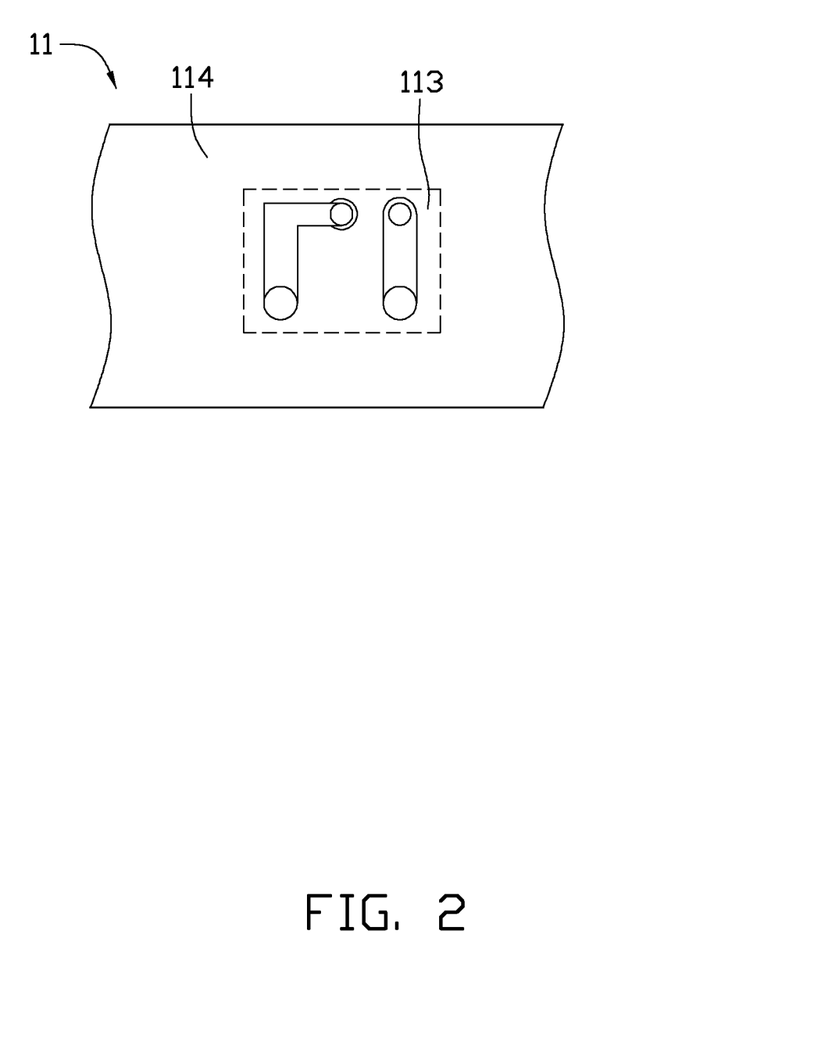
FIG. 2 is a top plan view of the first rigid substrate in FIG. 1.

Referring to FIG. 1 to FIG. 2, in step (1), a first substrate 11 is provided.

The first substrate 11 includes a first electrically conductive layer 110, a first insulating layer 111, and a second electrically conductive layer 112. The first insulating layer 111 is sandwiched between the first and second electrically conductive layers 110 and 112. The first electrically conductive layer 110 defines an exposed portion 113 and a laminating portion 114 surrounding the exposed portion 113. The first electrically conductive layer 110 defines circuit pattern therein, at least one solder pad is defined in the exposed portion 113 of the first electrically conductive layer 110. In the illustrated embodiment, the exposed portion 113 is rectangular, and the second electrically conductive layer 112 with a circuit pattern defined therein. In the present embodiment, the first rigid substrate 11 is a double-sided copper clad laminate (CCL), and both of the first and second electrically conductive layers 110, 112 are patterned copper foils.

It is noted that the circuit pattern of the laminating portion 114 is not shown in FIG. 1.

Figure 3:
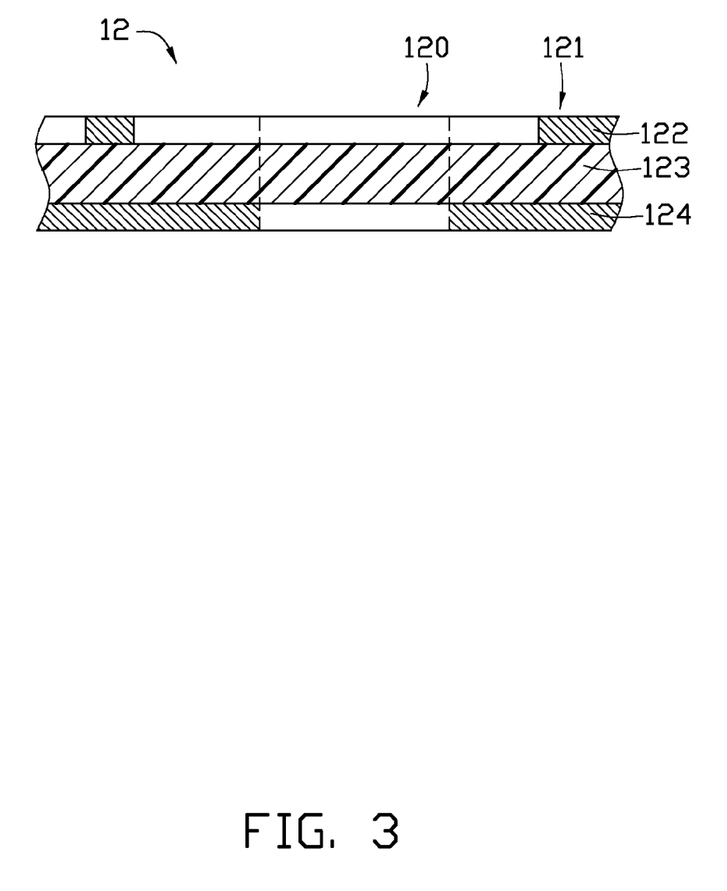
FIG. 3 is a cross-sectional view of a second rigid substrate, which includes an unwanted portion and a preserving portion corresponding to the exposed portion and the laminating portion of FIG. 1, respectively.

Referring to FIG. 3, in step (2), a second substrate 12 is provided.

The second substrate 12 includes an unwanted portion 120 and a preserving portion 121 surrounding the unwanted portion 120. The unwanted portion 120 corresponds to the exposed portion 113 and is rectangular. The preserving portion 121 corresponds to the laminating portion 114. The second substrate 12 includes a third electrically conductive layer 122, a second insulating layer 123, and a fourth electrically conductive layer 124. The second insulating layer 123 is sandwiched between the third and fourth electrically conductive layers 122 and 124. The third electrically conductive layer 122 defines circuit pattern therein. In the illustrated embodiment, the fourth electrically conductive layer 124 can define a circuit pattern therein. In the present embodiment, the second substrate 12 is a double-sided copper clad laminate (CCL), and both of the third and fourth electrically conductive layers 122 and 124 are patterned copper foils.

The first substrates 11 can also be a single sided copper clad laminate or a multi-layered printed circuit board. The second substrates 12 can also be a single sided copper clad laminate or a multi-layered printed circuit board.

Figure 4:
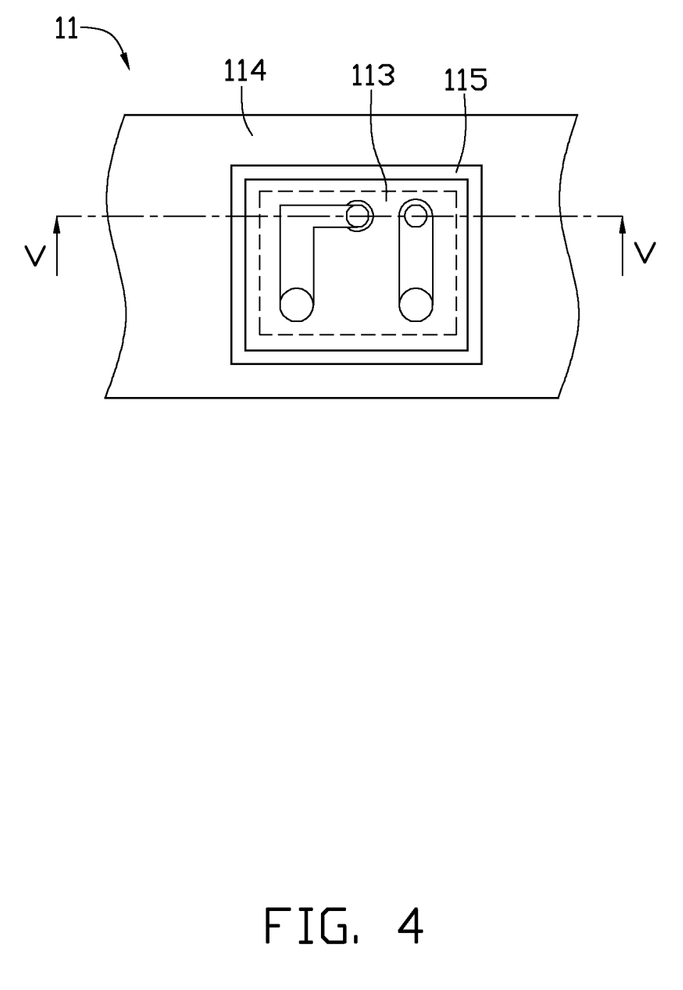
FIG. 4 is similar to FIG. 2, but showing a first annular bump extending along an imaginary boundary line of the exposed portion of the first substrate is formed.
Figure 5:
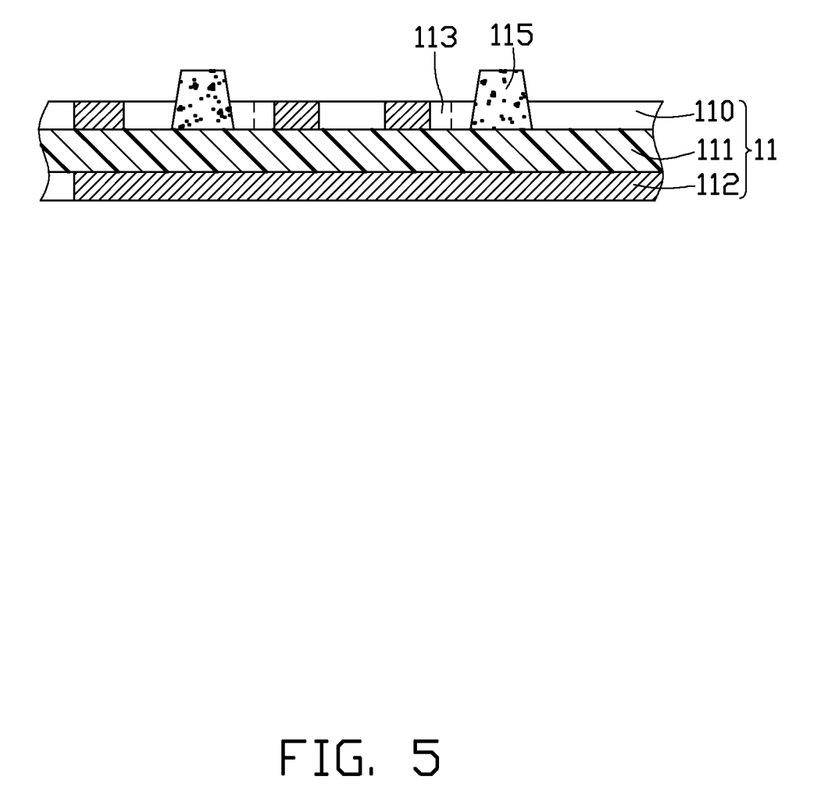
FIG. 5 is a sectional view of FIG. 4 taken along line V-V.

Referring to FIG. 4 to FIG. 5, in step (3), a first annular bump 115 extending along an imaginary boundary line of the exposed portion 113 of the first substrate 11 is formed at the first substrate 11. The first annular bump 115 is formed on the first insulating layer 111. In the present embodiment, the first annular bump 115 is rectangular.

The first annular bump 115 can be formed by the following steps. First, a screen printer and a printing ink are provided. The screen printer includes a base, a screen, and a scraper. The base is adapted for setting the first substrate 11. The screen is used for setting the printing ink and defines an annular leaking slot corresponding to the first annular bump 115. The scraper is configured for scraping the printing ink on the screen to make the printing ink leak from the screen to the first substrate 11 via the annular leaking slot. The printing ink is a material such as polyimide (PI), TEFLON, polyamide (PA), polymethylmethacrylate (PMMA), polycarbonate (PC), polyethylene terephthalate (PET), and polyamide polyethylene-terephthalate copolymer or any combination thereof. The printing ink is set on the screen. Second, the first substrate 11 is deposited on the base with the first electrically conductive layer 110 facing to the screen. Third, the printing ink is scraped by the scraper and leaks from the screen to the first substrate 11 via the annular leaking slot, thus the first annular bump 115 is obtained. Fourth, the first annular bump 115 is baked and fully cured.

Figure 6:
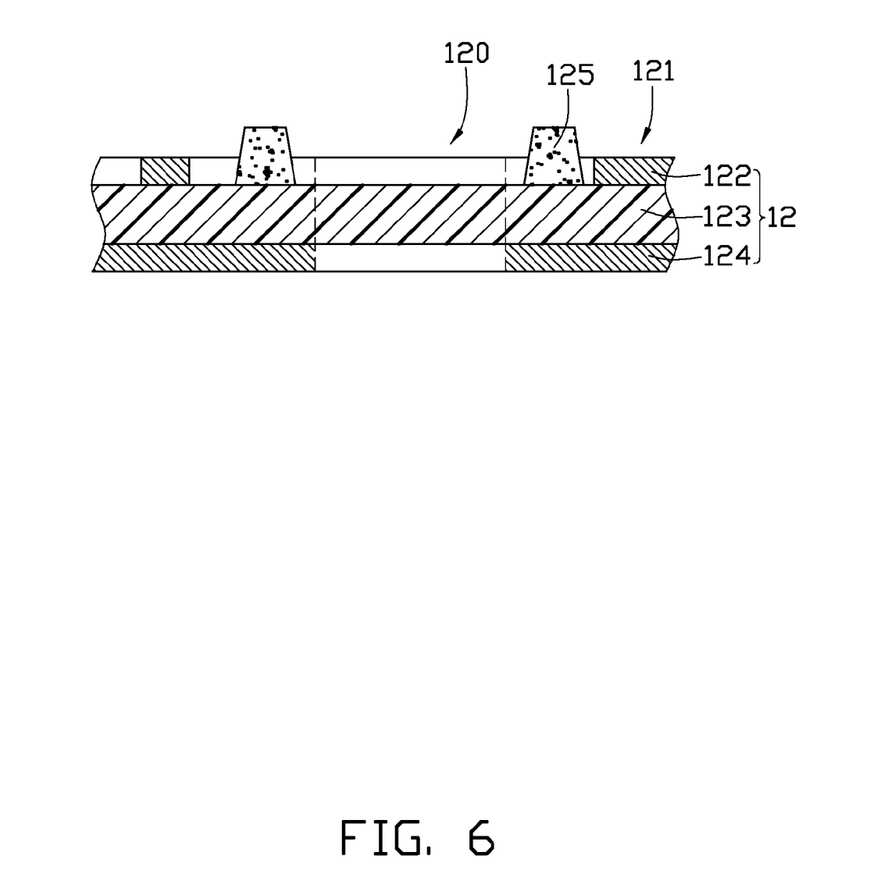
FIG. 6 is similar to FIG. 3, but showing a second annular bump extending along an imaginary boundary line of the unwanted portion of the second substrate is formed.

Referring to FIG. 6, in step (4), a second annular bump 125 is formed on the second substrate 12. The second annular bump 125 is formed on the second insulating layer 123, surrounds an boundary line of the unwanted portion 120, and corresponds to the first annular bump 115. In the present embodiment, the first and second annular bumps 115, 125 are all formed by screen printing.

The formation of the second annular bump 125 is similar to the formation of the first annular bump 115.

Figure 7:
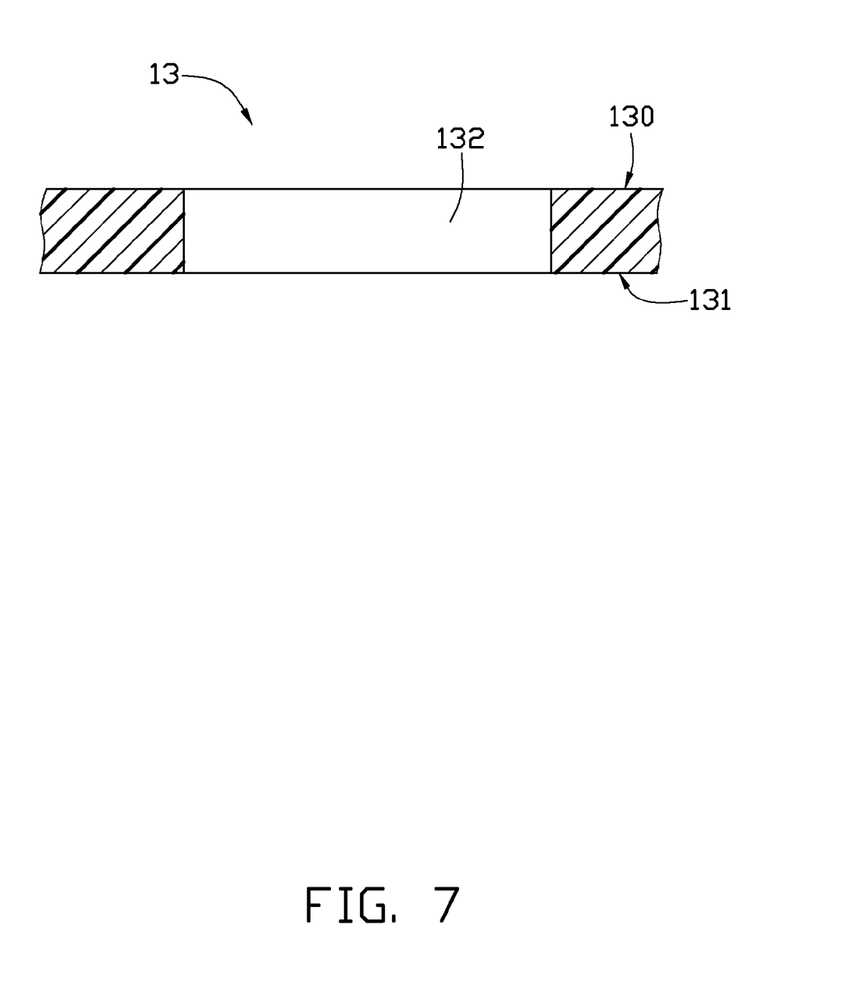
FIG. 7 is a cross-sectional view of a first adhesive layer, which defines an opening therein.

Referring to FIG. 7, in step (5), a first adhesive layer 13 is provided. The first adhesive layer 13 includes a first adhesive surface 130 and an opposite second adhesive surface 131. The first adhesive layer 13 defines an opening 132 through the first and second adhesive surfaces 130 and 131. The opening 132 generally corresponds to the exposed portion 113. In particular, a cross-section area of the opening 132 is bigger than that of the exposed portion 113. Thus, at least a portion of the first and second annular bumps 115, 125 are received in the opening 132. A material of the first adhesive layer 13 is the same as that of the first and second annular bumps 115 and 125.

Figure 8:
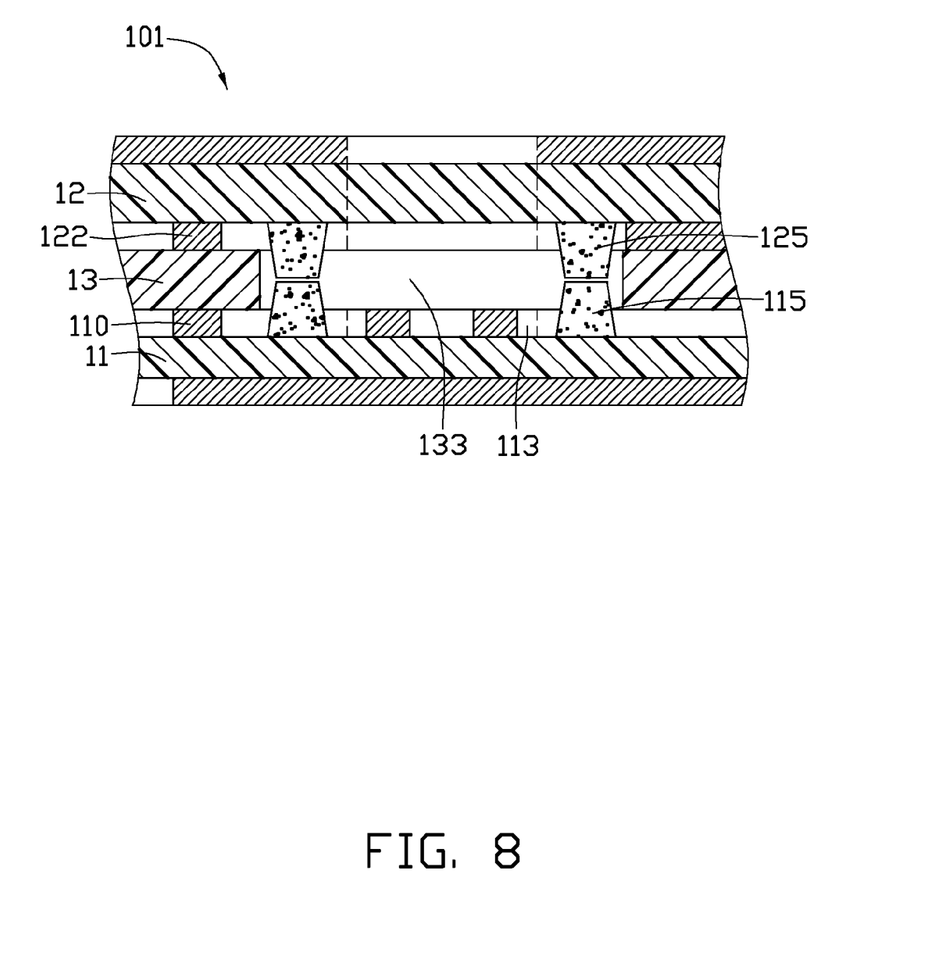
FIG. 8 shows the first substrate of FIG. 5, the second substrate of FIG. 6, and the first adhesive layer of FIG. 7 aligned with each other.
Figure 9:
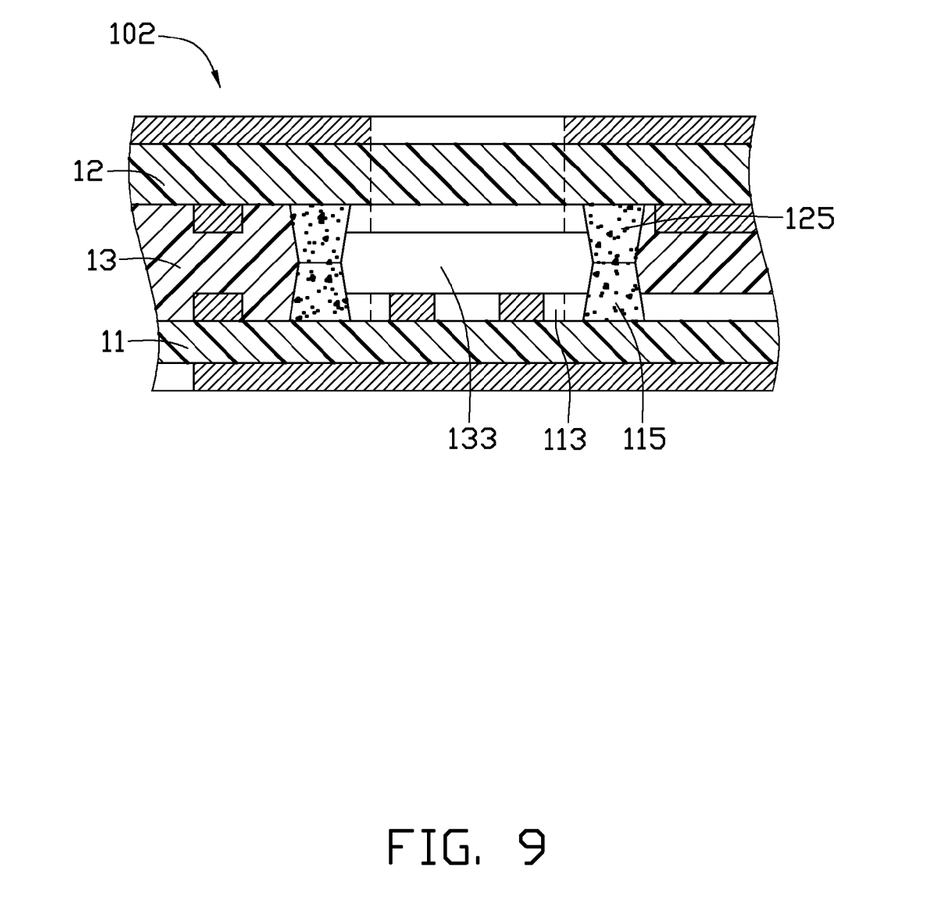
FIG. 9 is similar to FIG. 8, but showing the first substrate of FIG. 5, the second substrate of FIG. 6, and the first adhesive layer of FIG. 7 are laminated together to form a laminated structure.

Referring to FIGS. 8 and 9, in step (6), the first and second substrates 11, 12, and the first adhesive layer 13 are laminated together to form a laminated structure 102, wherein the first adhesive layer 13 is sandwiched between the first and second substrates 11 and 12. The exposed portion 113 and the unwanted portion 120 are all exposed in the opening 132, and the second annular bump 125 is in contact with the first annular bump 115.

First, the first substrate 11, the first adhesive layer 13, and the second substrate 12 are aligned with each other and stacked one on another in that order to form a stacked structure 101 shown in FIG. 8. The first adhesive surface 130 of the first adhesive layer 13 is in contact with the first electrically conductive layer 110, and the second adhesive surface 131 is in contact with the third electrically conductive layer 122. The exposed portion 113 is opposite to the unwanted portion 120. The laminating portion 114 is opposite to the preserving portion 121. The second annular bump 125 is opposite to the first annular bump 115, and at least a portion of each of the first and second annular bumps 115 and 125 can be received in the opening 132 of the first adhesive layer 13. In the stacked structure 101, there is a gap between the first and second annular bumps 115 and 125. That is, the summation of the heights of the first and second annular bumps 115, 125 is less than the distance between the first insulating layer 111 and the second insulating layer 123.

Second, the stacked structure 101 is compressed, thus a laminated structure 102 shown in FIG. 9 is obtained. During the compressing process, the second annular bump 125 is in contact with and bonds with the first annular bump 115, the first annular bump 115, the second annular bump 125, the first insulating layer 111, and the second insulating layer 123 define a cavern 133. The material of the first adhesive layer 13 is intenerated and flows, to fill the gap between the first and second insulating layers 111, 123 except for the cavern 133. Thus, the first adhesive layer 13 binds the preserving portion 121 and the laminating portion 114 together. In the compressing process, the distance between the first insulating layer 111 and the second insulating layer 123 decreases, thus in the laminated structure 102, the second annular bump 125 is in contact with the first annular bump 115. That is, the summation of the heights of the first and second annular bumps 115, 125 is equal to the distance between the first insulating layer 111 and the second insulating layer 123.

Only one annular bump formed on the first substrate 11 or the second substrate 12 will also work. For example, only an annular bump surrounding the exposed portion 113 of the first substrate 11 is formed on the first insulated layer 111, and no annular bump is formed on the second substrate 12. At least a portion of the annular bump is received in the opening 132 in the stacked structure 101 and the annular bump is in contact with the second insulated layer 123 in the laminated structure 102. The height of the annular bump is less than the distance between the first insulating layer 111 and the second insulating layer 123 in the stacked structure 101, the height of the bump is equal to the distance between the first insulating layer 111 and the second insulating layer 123 in the laminated structure 102. The situation is the same when only one annular bump extending along the unwanted portion 120 of the second substrate 12 is formed on the second insulated layer 123.

Figure 10:
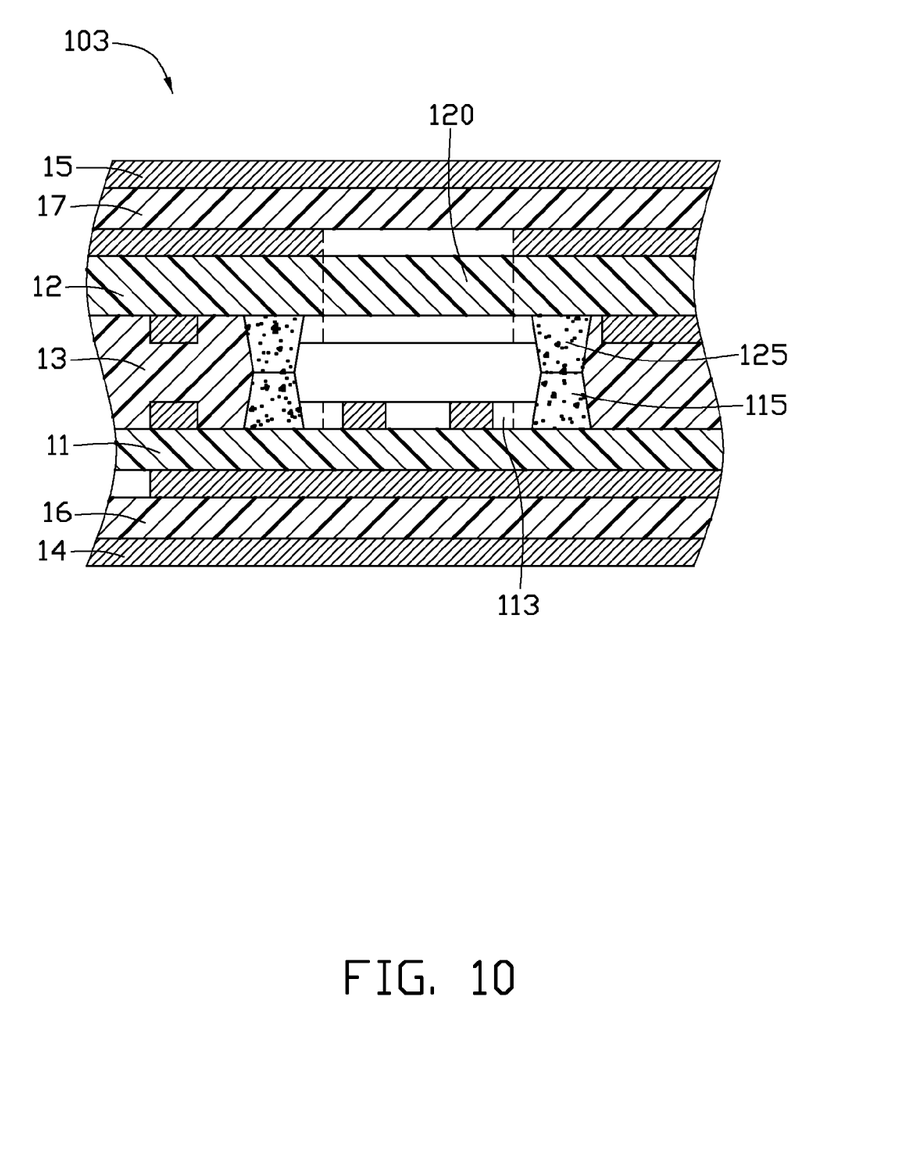
FIG. 10 is similar to FIG. 9, but showing a third substrate and a fourth substrate are laminated to the laminated structure.

Referring to FIG. 10, a third substrate 14, a fourth substrate 15, a second adhesive layer 16, and a third adhesive layer 17 are laminated to the laminated structure 102 prior to step (5). Both of the third and fourth substrates 14 and 15 include at least one electrically conductive layer. In the present embodiment, the third and fourth substrates 14 and 15 are copper foils. The second and third adhesive layers 16 and 17 can be a material the same as that of the first adhesive layer 13. The third substrate 14 and the second adhesive layer 16 are laminated onto the first substrate 11 of the laminated structure 102, the second adhesive layer 16 is sandwiched between the third substrate 14 and the first substrate 11. The fourth substrate 15 and the third adhesive layer 17 are laminated onto the second substrate 12, wherein the third adhesive layer 17 is sandwiched between the fourth substrate 15 and the second substrate 12. As such, a multilayer substrate 103 is obtained.

The lamination of the third and fourth substrates 14, 15 to the laminated structure 102 includes a step of stacking the third substrate 14, the second adhesive layer 16, the laminated structure 102, the fourth substrate 15, and the third adhesive layer 17 one on the other in that order, and a step of compressing the combined the third substrate 14, the second adhesive layer 16, the laminated structure 102, the fourth substrate 15, and the third adhesive layer 17.

The third and fourth substrates 14 and 15 can also be a single-sided CCL or a double-sided CCL.

Figure 11:
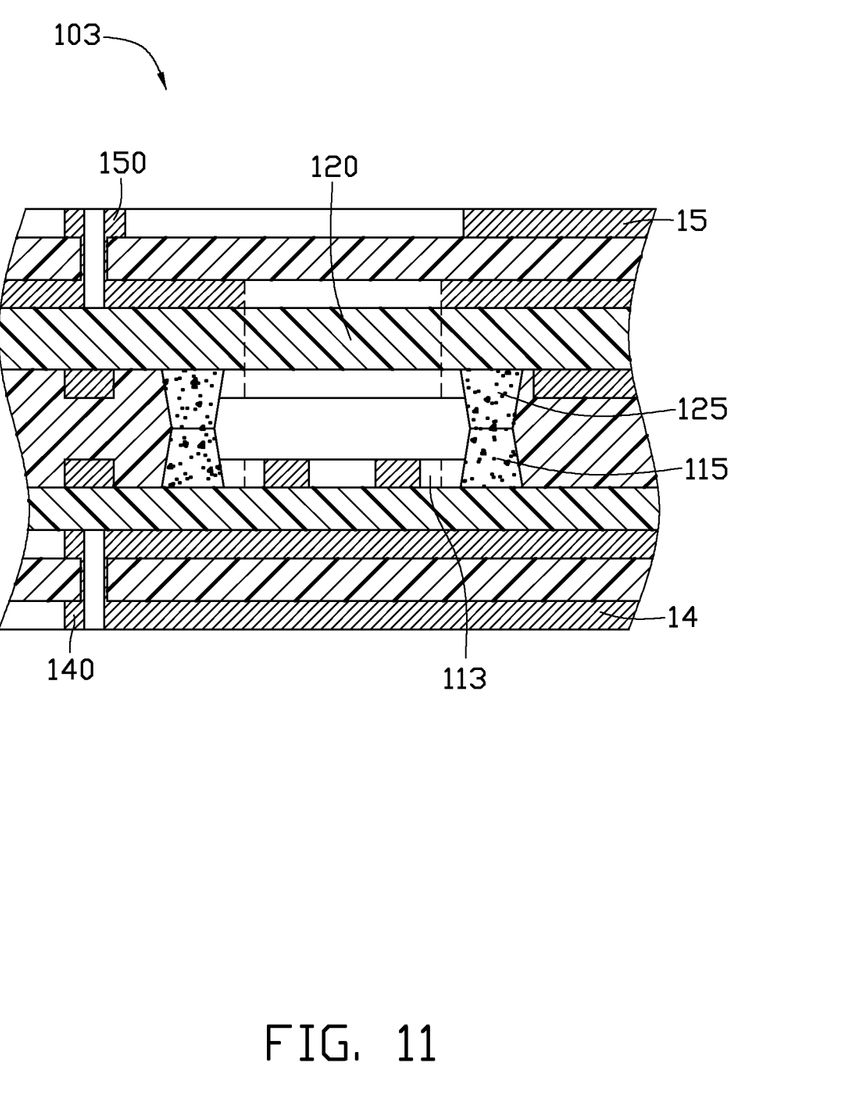
FIG. 11 is similar to FIG. 10, but showing an electrically conductive pattern is formed on both of the third and fourth substrates.

Referring to FIG. 11, after the multilayer substrate 103 is obtained, the third and fourth substrates 14 and 15 are patterned to form circuits thereon, thus a first electrically conductive pattern 140 and a second electrically conductive pattern 150 are obtained. Furthermore, a plurality of plated through holes can be formed in the multilayer substrate 103 to electrically connect the first electrically conductive pattern 140, the second electrically conductive layer 112, the second electrically conductive pattern 150, and the fourth electrically conductive layer 124.

Figure 12:
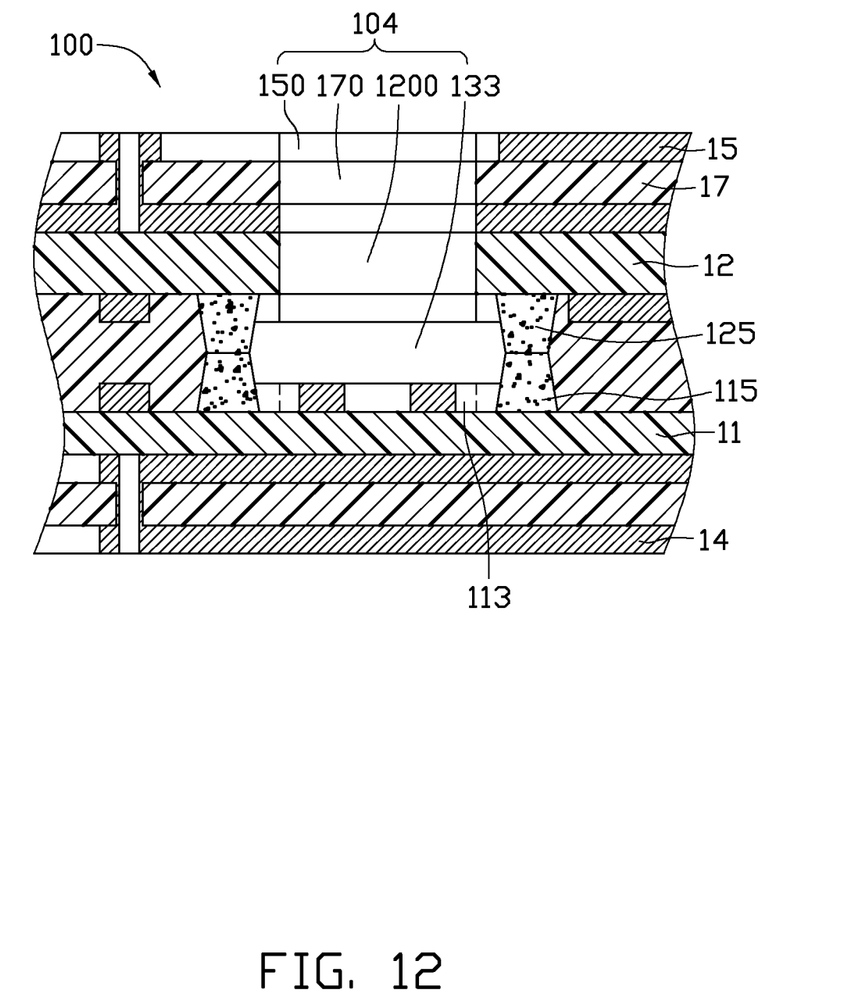
FIG. 12 similar to FIG. 11, but showing a cavity is defined.

Referring to FIG. 12, in step (5), a cavity 104 is defined in the laminated structure 103, by removing a portion of the fourth substrate 15, a portion of the third adhesive layer 17, and the unwanted portion 120 above the cavern 133. A laser beam, a milling cutter, or other means can be used to cut the fourth substrate 15, third adhesive layer 17, and the second substrate 12 along the imaginary boundary lines between the unwanted portion 120 and the preserving portion 121. The imaginary boundary lines between the unwanted portion 120 and the preserving portion 121 corresponds to the borderlines between the exposed portion 113 and the laminating portion 114 of the first substrate 11. A first slit 150 is defined after a portion of the fourth substrate 15 above the cavern 133 is removed. A second slit 170 is defined after a portion of the third adhesive layer 17 above the cavern 133 is removed. A third slit 1200 in communication with the cavern 133 is defined after the unwanted portion 120 above the cavern 133 is removed. The first slit 150, the second slit 170, the third slit 1200, and the cavern 133 compose the cavity 104, thus a printed circuit board 100 with the cavity 104 is obtained. The exposed portion 113 is exposed in the cavity 104, thus an electronic component, such as a chip, can be installed in the cavity 104 and in electrically communication with the solder pad in the first electrically conductive layer 110.

In the present embodiment, the first annular bump 115 and the second annular bumps 125 are formed on the first and second substrates 11, 12 prior to the laminating step. In the laminating step, the first and second annular bumps 115, 125 can prevent the material of the first adhesive layer 13 from flowing into the cavern 133 to contaminate the exposed portion 113 during the laminating process. Thus, no protecting glue is needed to protect the exposed portion 113 before being laminated, no extra removing process is needed after the unwanted portion 120 of the second substrate 12 is removed. Furthermore, the cost is decreased, the manufacturing of the printed circuit board with cavity is simplified, and the reliability of the connection between the solder pad and the electronic component is increased.

While certain embodiments have been described and exemplified above, various other embodiments will be apparent to those skilled in the art from the foregoing disclosure. The present disclosure is not limited to the particular embodiments described and exemplified but is capable of considerable variation and modification without departure from the scope of the appended claims.

What is claimed is:

1. A method for manufacturing a printed circuit board, comprising:
    providing a first substrate, the first substrate comprising a first electrically conductive layer and a first insulating layer, the first electrically conductive layer comprising an exposed portion and a laminating portion surrounding the exposed portion;
    providing a second substrate, the second substrate comprising an unwanted portion corresponding to the exposed portion and a preserving portion corresponding to the laminating portion;
    forming a first annular bump on the first insulating layer of the first substrate, the first annular bump extending along an imaginary boundary line of the exposed portion of the first substrate;
    forming a second annular bump on the second substrate, the second annular bump extending along an imaginary boundary line of the unwanted portion of the second substrate, the second annular bump corresponding to the first annular bump;
    providing a first adhesive layer which defines an opening therein;
    laminating the first substrate, the second substrate, and the first adhesive layer together to form a laminated structure, wherein the first adhesive layer is sandwiched between the first and second substrates, the exposed portion and the unwanted portion are exposed in the opening, and the second annular bump is in contact with the first annular bump; and
    removing the unwanted portion of the second substrate and defining a cavity in the laminated structure, the exposed portion being exposed in the cavity.

2. The method of claim 1, wherein the first and second annular bumps are formed by screen printing.

3. The method of claim 1, wherein at least a portion of each of the first and second annular bumps is received in the opening.

4. The method of claim 1, wherein the first substrate, the first adhesive layer, and the second substrate are stacked one on another in that order to obtain a stacked structure prior to the laminating step, the second annular bump is opposite to the first annular bump in the stacked structure, in the laminating step, the first adhesive layer bonds the preserving portion and the laminating portion together.

5. The method of claim 1, wherein the first electrically conductive layer defines a circuit pattern therein, the second substrate comprises a second insulating layer and a second electrically conductive layer with a circuit pattern defined therein, the second annular bump is formed on the second insulating layer, the summation of the heights of the first and second annular bumps is less than the distance between the first insulating layer and the second insulating layer in the stacked structure, the summation of the heights of the first and second annular bumps is equal to the distance between the first insulating layer and the second insulating layer in the laminated structure.

6. The method of claim 1, wherein a material of the first adhesive layer is same as that of the first and second annular bumps.

7. The method of claim 1, wherein after the laminating step, a third substrate and a second adhesive layer are laminated onto the first substrate, the second adhesive layer is sandwiched between the third substrate and the first substrate, a fourth substrate and a third adhesive layer are laminated onto the second substrate, wherein the third adhesive layer is sandwiched between the fourth substrate and the second substrate.

8. The method of claim 7, wherein the third and fourth substrates are patterned to form circuits thereon.

\* \* \* \* \*

UNITED STATES PATENT AND TRADEMARK OFFICE
CERTIFICATE OF CORRECTION

PATENT NO. : 8,978,244 B2
APPLICATION NO. : 13/116001
DATED : March 17, 2015
INVENTOR(S) : Xue-Jun Cai, Zhi-Yong Li and Chao Liu

It is certified that error appears in the above-identified patent and that said Letters Patent is hereby corrected as shown below:

On the title page

Please replace item 73 regarding "Assignees" with the following:

(73) Assignees: FuKui Precision Component (Shenzhen) Co., Ltd., Shenzhen (CN); Zhen Ding Technology Co., Ltd., Tayuan, Taoyuan (TW).

Signed and Sealed this
First Day of December, 2015

Michelle K. Lee
*Director of the United States Patent and Trademark Office*